US006984341B2

(12) United States Patent
Go et al.

(10) Patent No.: US 6,984,341 B2
(45) Date of Patent: Jan. 10, 2006

(54) MIXTURES COMPRISING THIOPHENE/ANION DISPERSIONS AND CERTAIN ADDITIVES FOR PRODUCING COATINGS EXHIBITING IMPROVED CONDUCTIVITY, AND METHODS RELATED THERETO

(75) Inventors: Pin Go, Lowell, MA (US); Dieter Freitag, Chelmsford, MA (US); John W. Connell, Yorktown, VA (US)

(73) Assignee: Elecon, Inc., Chelmsford, MA (US)

( * ) Notice: Subject to any disclaimer, the term of this patent is extended or adjusted under 35 U.S.C. 154(b) by 271 days.

(21) Appl. No.: 10/349,285

(22) Filed: Jan. 21, 2003

(65) Prior Publication Data

US 2003/0193042 A1    Oct. 16, 2003

Related U.S. Application Data

(60) Provisional application No. 60/350,397, filed on Jan. 22, 2002.

(51) Int. Cl.
*H01B 1/12* (2006.01)
*B05D 5/12* (2006.01)
(52) U.S. Cl. .................. 252/500; 427/165; 427/384
(58) Field of Classification Search ................ 252/500; 427/165, 384

See application file for complete search history.

(56) References Cited

U.S. PATENT DOCUMENTS

| | | | | |
|---|---|---|---|---|
| 5,035,926 A | * | 7/1991 | Jonas et al. ............... | 427/393.1 |
| 5,286,414 A | * | 2/1994 | Kampf et al. .............. | 252/500 |
| 5,595,689 A | * | 1/1997 | Kulkarni et al. ........... | 252/500 |
| 5,766,515 A | * | 6/1998 | Jonas et al. ............... | 252/500 |
| 6,452,711 B1 | * | 9/2002 | Heuer et al. ............... | 359/265 |
| 6,663,956 B2 | * | 12/2003 | Heberger et al. .......... | 428/332 |
| 6,793,690 B2 | * | 9/2004 | Kudoh et al. .............. | 29/25.03 |

FOREIGN PATENT DOCUMENTS

| | | | |
|---|---|---|---|
| EP | 1003179 | * | 5/2000 |
| WO | WO 2004/021366 | * | 3/2004 |

* cited by examiner

*Primary Examiner*—Mark Kopec
(74) *Attorney, Agent, or Firm*—Raymond A. Miller; Pepper Hamilton LLP

(57) ABSTRACT

Disclosed are mixtures comprising aqueous thiophene/anion dispersions, such as polythiophene/polystyrene sulfonate aqueous dispersions, and additives, as well as coatings produced therefrom. Coatings produced from these mixtures yield significant improvements in electrical conductivity without the need for a high temperature treatment as compared to coatings produced from unmodified aqueous polythiophene dispersions (e.g., Baytron®P) and to coatings produced from state-of the-art aqueous polythiophene-additive mixtures. These conductivity improvements are achieved without detracting from the optical transparency of the coating. Because characteristics of volume resistivity of less than 6.6 ohm·cm and optical transmission greater than 80% are important for conductive coating applications, coatings produced from the mixtures of the present invention have significant advantages over coatings produced from the state-of-the-art mixtures in many applications.

Also disclosed are a variety of substrates or articles of manufacture coated with the mixtures of the present invention for use in various applications where a combination of high electrical conductivity, excellent optical transparency and low temperature processing are important, such as electronic and optoelectronic devices.

14 Claims, 7 Drawing Sheets

Surface Resistance of Baytron®P/γ-Butyrolactone Coatings

Cyclic Aliphatic Ketals

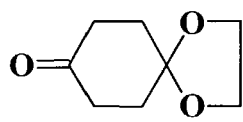

Cyclohexanedione mono ethylene ketal

Cyclohexanone ethylene ketal

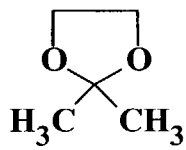

2,2-Dimethyl-1,3-dioxolane

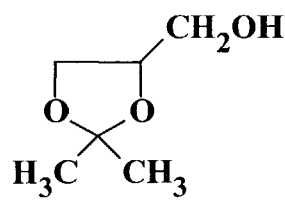

2,2-Dimethyl-3-methylhydroxy 1,3-dioxolane

Cyclic Aliphatic Lactones

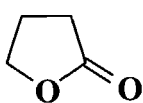

γ-Butyrolactone

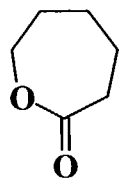

ε-Caprolactone

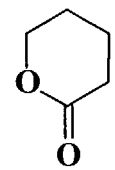

Δ-Valerolactone

Cyclic Aliphatic Carbonates

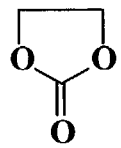

Ethylene carbonate

Cyclic Oxides

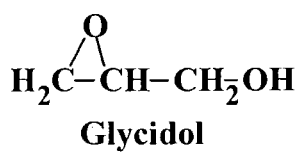

Glycidol

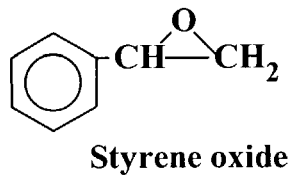

Styrene oxide

Figure 1A. Chemical structures of preferred additives

Cyclic Diketone
Ninhydrin
Anhydrides
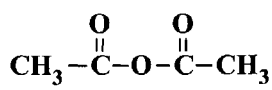 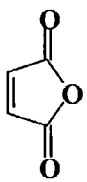 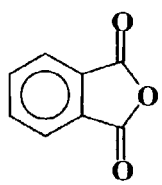
Acetic Anhydride     Maleic Anhydride     Phthalic Anhydride
Aminocarbonic Acids
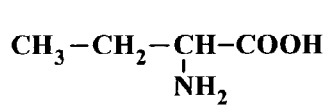 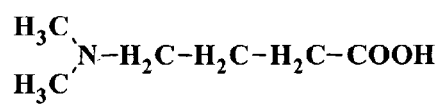
2-Aminobutyric Acid     4-(Dimethylamino)butyric Acid
Aliphatic Carbonic Acid
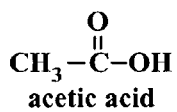
acetic acid
Figure 1B. Chemical structures of preferred additives

Phenols
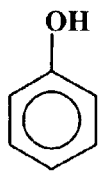 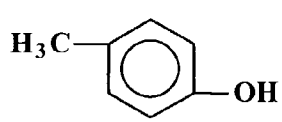 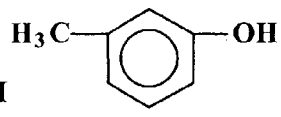 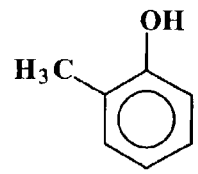
Phenol     4-Methylphenol (p-cresol)     3-Methylphenol (m-cresol)     2-Methylphenol (o-cresol)
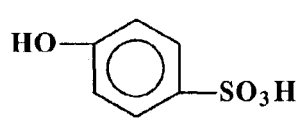     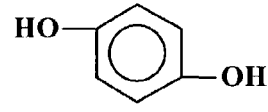
4-Hydroxybenzene Sulfonic Acid     4-Hydroxyphenol
Inorganic Acid
Phosphoric Acid
Figure 1C. Chemical structures of preferred additives

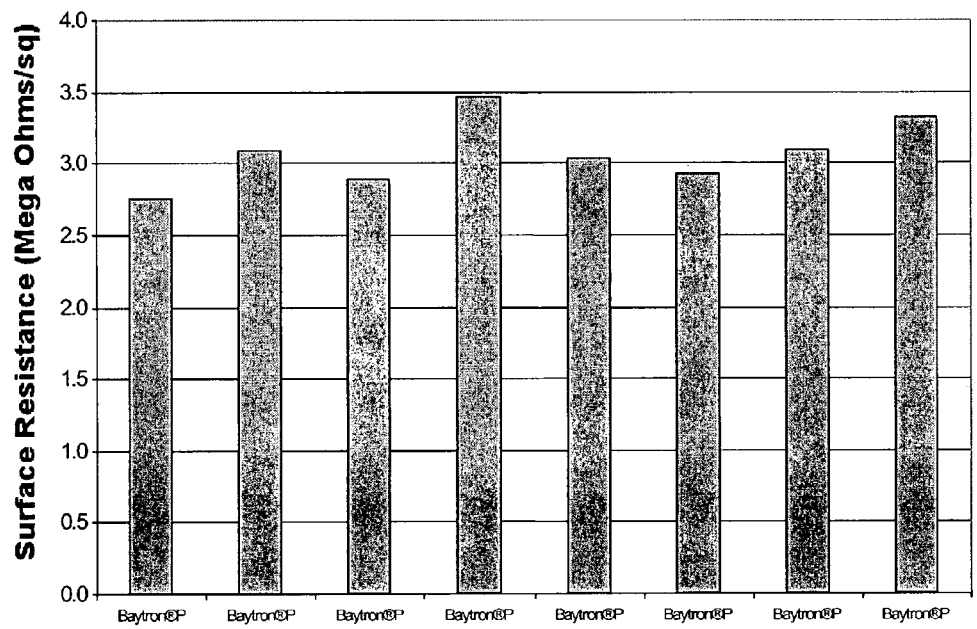
Figure 2. Surface Resistance of Baytron®P Coatings

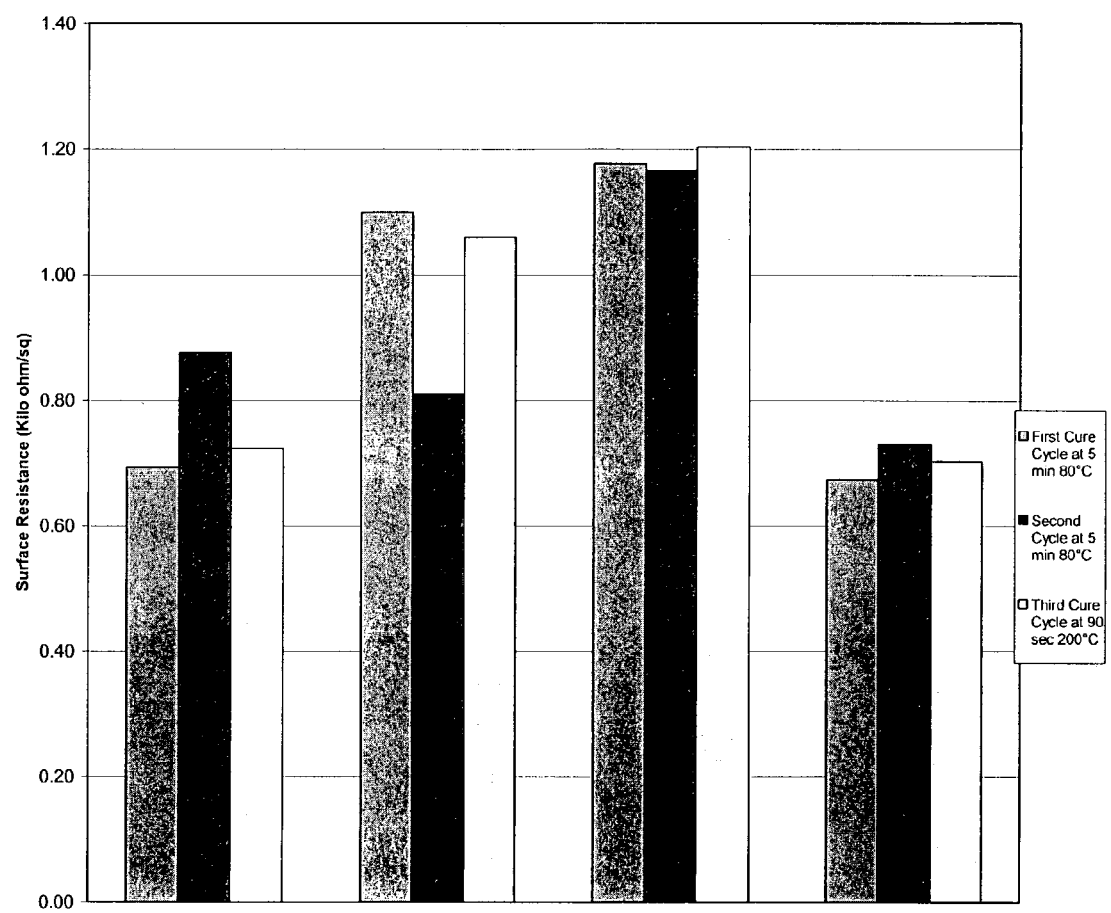
Figure 3. Surface Resistance of Baytron®P Coatings as a Function of Drying Conditions

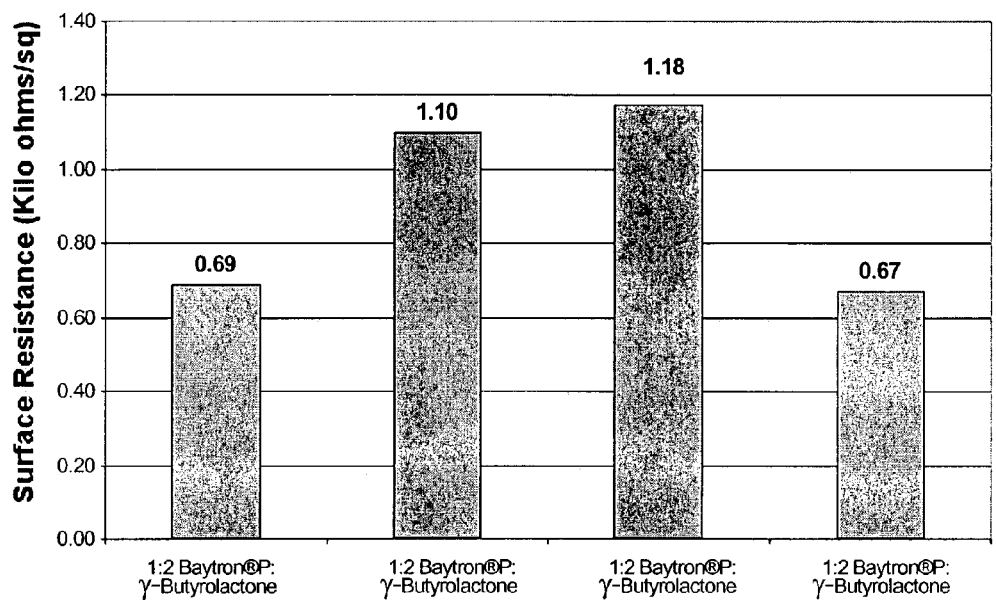
Figure 4. Surface Resistance of Baytron®P/γ-Butyrolactone Coatings

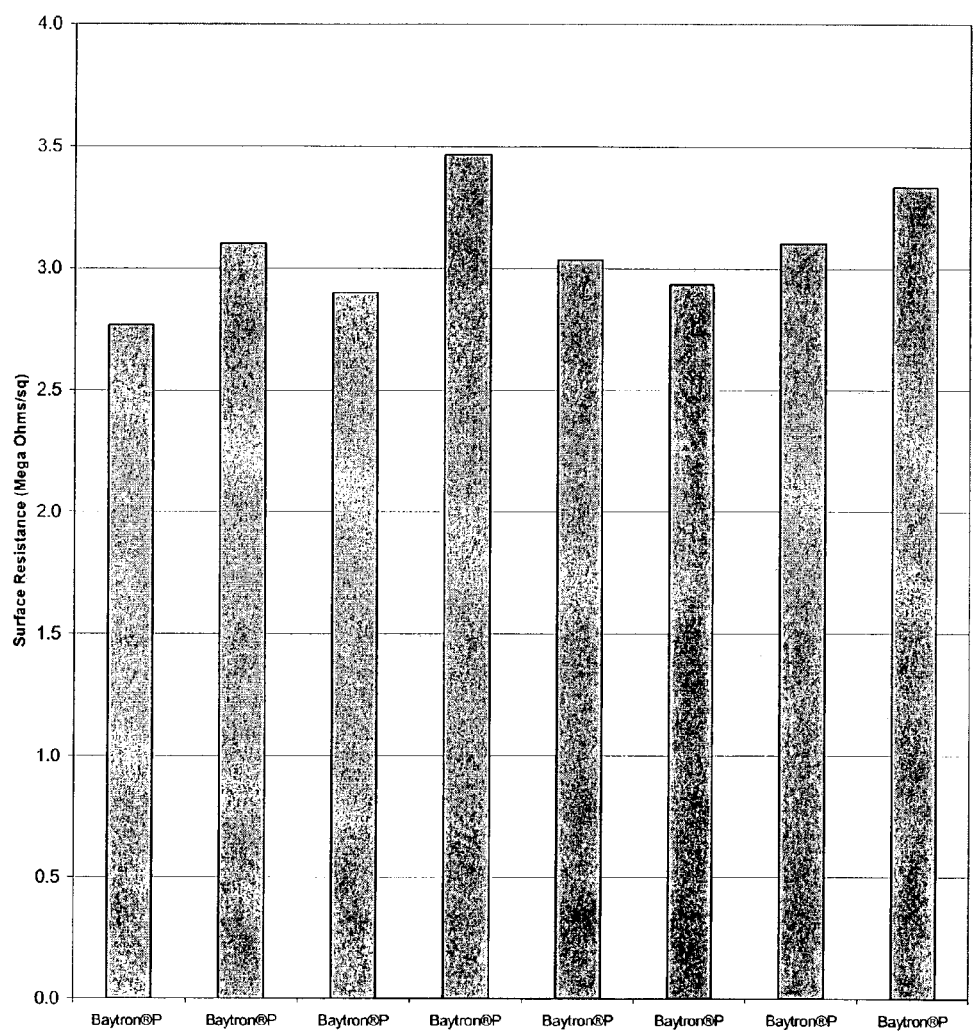
Figure 5. Effect of Drying Conditions on the Surface Resistance of Baytron®P/γ-Butyrolactone Coatings

MIXTURES COMPRISING THIOPHENE/ANION DISPERSIONS AND CERTAIN ADDITIVES FOR PRODUCING COATINGS EXHIBITING IMPROVED CONDUCTIVITY, AND METHODS RELATED THERETO

CROSS REFERENCE TO RELATED APPLICATION

The present application claims the benefit of and priority to U.S. Provisional Application No. 60/350,397, as filed on Jan. 22, 2002.

FIELD OF INVENTION

The present invention relates generally to electrically conductive organic polymers, more specifically to aqueous mixtures comprising thiophene/anion dispersions and additives, and coatings and articles produced therefrom. These mixtures provide significant improvements in electrical conductivity without detracting from optical transmission and without requiring high temperature thermal treatment.

BACKGROUND

Conducting polymers (CP's) have received considerable attention in recent years due to their potential applications in a variety of electronic devices. CP's are presently used in commercial products, such as anti-static coatings on plastics, photographic film and electronic packaging materials. Other CP applications include solid electrode capacitors, through-hole plating of printed circuit boards, coatings for cathode ray tubes (to prevent dust attraction), hole injecting layers on indium tin oxide (ITO) substrates for electroluminescent devices, and sensors. Future applications, such as an ITO replacement leading to completely flexible, organic electronic devices, will require improvement in conductivity without sacrificing other properties such as optical transparency.

A variety of conducting polymers are described in the art, and several are commercially available, such as Baytron®P (product of Bayer AG) and Panipol® (product of Panipol Ltd.). Of the different CP families, (i.e., polyacetylenes, polyphenylenes, poly(p-phenylenevinylene)s, polypyrroles, polyanilines, and polythiophenes) polythiophenes are arguably the most stable thermally and electronically [see, "Handbook of Oligo- and Polythiophenes", D. Fichou, Editor, Wiley-VCH, New York (1999), J. Roncali, *Chem. Rev.*, 97, 173 (1997), A. Kraft, A. C. Grimsdale and A. B. Holmes, *Angew. Chem.*, 110, 416 (1998), J. Roncali, *J Mater. Chem.*, 9, 1875 (1999), J. Roncali, *Annu. Rep. Prog. Chem. Sec. C.*, 95, 47 (1999), A. J. Heeger, *Synth. Met.*, 55–57, 3471 (1993) and G. Kobmehl and G. Schopf, *Adv. Polym. Sci.*, 129, 1 (1996)]. The Baytron®P product is a polythiophene/polystyrene sulfonate composition available as an aqueous dispersion containing about 1.3% solids. This aqueous dispersion is typically used to prepare coatings on various substrates. Baytron®P is prepared from 3,4-ethylenedioxythiophene (EDT) in aqueous or predominately aqueous media in the presence of polystyrene sulfonic acid (PSS, a dopant) using an oxidant such as iron trichloride [see, L. B. Groenendaal, F. Jonas, D. Freitag, H. Pielartzik and J. R. Reynolds, *Adv. Mater.*, 12(7), 481 (2000)]. Coatings derived from Baytron®P have been reported to exhibit a wide range of surface resistance depending upon coating thickness. The surface conductivity of Baytron®P, and that of other CP based coatings, will increase with increasing coating thickness while the optical transmission will decrease. In most coating applications, the coatings must exhibit a useable combination of electrical conductivity, optical transparency and environmental stability (i.e., stability to moisture and oxygen). The appropriate balance of these properties is of critical importance; thus a means for improving this balance of properties would represent a significant advancement and enable new applications for these materials.

One approach to improving the electrical conductivity of polythiophenes has been via the use of additives (see e.g., U.S. Pat. No. 5,766,515). It has been shown that certain additives, when mixed with Baytron®P aqueous dispersion and subsequently used to make coatings, can produce an increase in the electrical conductivity (i.e., decrease in surface resistivity); however a high temperature treatment (at about 200° C.) is required to realize this improvement. The high temperature treatment is a major disadvantage because certain substrates cannot tolerate such high temperatures.

No explanation of the mechanism associated with conductivity enhancement is offered in the art; thus it is impossible to elucidate what additives may bring about this increase in electrical conductivity. Although the use of D-sorbitol (a sugar derivative) as an additive to Baytron®P is shown in the art as affecting electrical conductivity improvement, the enhancement in conductivity is only realized after shock drying at 200° C. for at least 90 seconds. The reported measured decrease in surface resistance (in the best case) is from about 3500 ohm/square to about 100 ohm/square. Because the coating thickness information for such coatings is not given, the volume resistivity of these coatings cannot be calculated. The high temperature shock drying at 200° C. step limits the use of the additive technology described in the art, as this temperature may exceed the thermal capability or cause deleterious shrinkage of certain plastic substrates. Further, the effects of this additive technology on optical transparency are not available.

SUMMARY OF THE INVENTION

In view of the above, there is a need to formulate mixtures containing thiophene/anion dispersions and additives for producing coatings that exhibit improved conductivity without decreased optical transparency. There is also a need for a producing such coatings without employing a high temperature heat treatment.

It is, therefore, an object of the present invention to formulate mixtures comprising thiophene/anion dispersions and additives for producing coatings that exhibit improved conductivity without decreased optical transparency.

It is another object of the present invention to provide a method for producing such coatings without employing a high temperature heat treatment.

It is yet another object of the present invention to produce substrates or articles coated with the mixtures comprising thiophene/anion dispersions and additives for use in electronic or optoelectronic devices.

The present invention pertains to certain additives that, when mixed with thiophene/anion dispersions, particularly polythiophene/polystyrene sulfonate aqueous dispersions, more particularly the commercially available dispersion Baytron®P, impart an improved combination of processing characteristics, electrical conductivity and optical transparency into coatings produced therefrom. The improvement in this combination of properties is significant as compared to unmodified Baytron®P and to state-of-the-art examples that contain additives (as disclosed in U.S. Pat. No. 5,766,515). The mixtures of the present invention offer significant advantages over the state-of-the-art technology, which thereby make these mixtures more attractive for existing applications and enable new applications. The mixtures of the present invention have a wide spectrum of coating-based applications and allow for the coating of a variety of substrates, including but not limited to, organic polymers, inorganic substrates, and carbon-based substrates. These new mixtures can be fabricated into a variety of material forms, such as coatings, fibers, fabrics, and foams. They can be used, under mild processing temperatures, to render a variety of articles and substrates electrically conductive without affecting optical transparency.

The above summary of the present invention is not intended to describe each illustrated embodiment or every implementation of the present invention. The figures and the detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which:

FIGS. 1A, 1B and 1C illustrate the chemical structures of the preferred additives according to an embodiment of the present invention;

FIG. 2 graphically illustrates the surface resistance of multiple Baytron®P coatings on polycarbonate, coated with a primer, after drying for 5 minutes at 80° C.;

FIG. 3 graphically illustrates the change in surface resistance as a result of different drying treatments, per FIG. 2;

FIG. 4 graphically illustrates the surface resistance of Baytron®P/γ-butyrolactone coatings, on polycarbonate substrate, according to an embodiment of the present invention; and FIG. 5 graphically illustrates the effect of drying conditions on the surface resistance of Baytron®P/γ-butyrolactone coatings, on polycarbonate substrate, according to an embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF PREFERRED EMBODIMENTS

The present invention pertains to aqueous mixtures containing a thiophene/anion dispersion and an at least one additive. The term "thiophene/anion dispersion", as used herein, refers to a dispersion consisting essentially of an oliogmer, dendrimer or polymer containing thiophene groups in a cationic form with an anionic compound, anionic oligomer, anionic dendrimer or anionic polymer, and water. The term "additive", as used herein, describes the species that are combined with a thiophene/anion dispersion, particularly a polythiophene/polystyrene sulfonate aqueous dispersion, more particularly the commercially available dispersion Baytron®P, to arrive at mixtures for producing coatings that exhibit a significant improvement in the combination of electrical conductivity and processing characteristics with no decrease in optical transparency as compared to coatings produced from state-of-the-art mixtures. The term "state-of-the-art", as used herein, refers to mixtures comprising polythiophene/polystyrene sulfonate aqueous dispersion and an additive (and coatings produced therefrom) as disclosed in U.S. Pat. No. 5,766,515 as this art reference discloses the most advanced technology comprising thiophene/anion aqueous dispersions, especially as pertaining to the polythiophene/polystyrene sulfonate aqueous dispersions, and additives known at this time.

The improvements in electrical conductivity and processing characteristics of the coatings of the present invention are achieved while using relatively low drying temperatures (from about 80° C. to about 130° C.). The present invention overcomes limitations of the state-of-the-art mixtures and coatings produced therefrom by providing a significant improvement in this combination of properties without requiring a high temperature heat treatment.

Baytron®P (available from Bayer AG, Pittsburg, Pa.), based on product literature, consists essentially of poly(3,4-ethylenedioxythiophene) doped with the polyanion of polystyrene sulfonic acid, also referred to as polystyrene sulfonate (PSS), dispersed in aqueous media at a concentration of about 1.2–1.3% solids. Other components, such as wetting agents, leveling agents, surfactants, organic binders, polymeric binders, crosslinking agents, coupling agents and dispersing agents or any combination thereof may also be present in this formulation.

A variety of additives can be useful in the mixtures of the present invention, and these additives can be added to the thiophene/anion dispersions, such as the commercially available Baytron®P polythiophene/polystyrene sulfonate aqueous dispersions, particularly at several different concentrations. The preferred concentrations of the additives used herein are calculated as follows. The Baytron®P aqueous dispersion contains 1.3% by weight of polythiophene/polystyrene sulfonate, thus 100 g of Baytron®P solution contains 1.3 g of solids. A 1:1 mixture of Baytron®P:additive would thus consist of an equal amount, by weight, of polythiophene/polystyrene sulfonate and additive.

The preferred additives for use herein (see FIG. 1) can be classified broadly as cyclo-aliphatic ketals, cyclo-aliphatic lactones, cyclo-aliphatic carbonates, cyclic-oxides, cyclic triketones, anhydrides, aminocarbonic acids, aliphatic monocarbonic acids, phenols and inorganic acids. From each broad class of preferred additives, there are more preferred additives that yield even better results. These more preferred additives give rise to coatings with volume resistivities less than 0.3 ohm·cm when dried at only 80° C. for 5 minutes. Examples of more preferred additives include 2,2-dimethyl-1,3-dioxolane, cyclohexanone ethylene ketal, cyclohexanedione mono ethylene ketal, and 2,2-dimethyl-3-methylhydroxy-1,3-dioxolane from the cyclo-aliphatic ketal class (these additives are manufactured by Lancester Synthesis Corp., Windham, NH; Fluka Holding AG, Buchs, Switzerland; and Lancester Synthesis Corp., respectively); Δ-valerolactone, ε-caprolactone and γ-butyrolactone from the cyclo-aliphatic lactone class (these additives are manufactured by Fluka Holding AG; Dow Chemical Co., Midland, Mich.; and BASF Corp., Hannibal, Mo., respectively); ethylene carbonate from the cyclo aliphatic carbonate class (this additive is manufactured by Fluka Holding AG); styrene oxide and glycidol from cyclic-oxide class (these additives are manufactured by Fluka Holding AG); ninhydrin from the cyclic diketone class (this additive is manufactured by Fluka Holding AG); maleic anhydride, phthalic anhydride, and acetic anhydride from the anhydride class (these additives are manufactured by Fluka Holding AG; BASF Corp.; and Mallinckrodt Baker Inc., Phillipsburg, N.J., respectively); 2-aminobutyric acid and 4-(dimethylamino) butyric acid from the aminocarbonic acid class (this additive is manufactured by Fluka Holding AG) and acetic acid from the aliphatic carbonic acid class (this additive is commercially available from Sigma-Aldrich Corp., San Louis, Mo.); cresols (ortho, meta and para), phenol, 4-hydroxyphenol, and 4-hydroxybenzene sulfonic acid from the phenol class (these additives are manufactured by Sumitomo Chemical America, New York, N.Y.; Mallinckrodt Baker Inc.; Eastman Chemical Co., Kingsport, Tenn.; and Lancester Synthesis Corp., respectively); and phosphoric acid from the inorganic acids class (this additive is manufactured by Mallinckrodt Baker Inc.). The chemical derivatives of these broad classes of functional groups may also be utilized as additives in the mixtures of the present invention. Further, a combination (i.e., more than one) of the preferred additives provided herein or their derivatives may also be utilized in the mixtures of the present invention. Furthermore, the preferred additives, their derivatives, or any combination thereof that are incorporated into an oligomer, a dendrimer or a polymer may also be utilized as additives in the mixtures of the present invention.

It is contemplated that mixtures of the present invention may comprise other components, such as wetting agents, leveling agents, surfactants, organic binders, polymeric binders, crosslinking agents, coupling agents, dispersing agents, or any combination thereof.

The mixtures of the present invention can be fabricated into a variety of material forms, such as coatings, fibers, fabrics, and foams. Coatings can be produced from these mixtures using a variety of coating techniques, such as spin coating, spray coating, roll coating or hand drawing or any other common coating technique onto glass or plastic substrates or articles of manufacture. The coatings produced from these mixtures are subsequently dried.

Substrates or articles of manufacture coated with the mixtures of the present invention may be utilized in a variety of applications, such as in the manufacture of electronic or opto-electronic devices. These applications include the following: touch-screens, organic light emitting diodes (OLED), polymer light emitting diodes (PLED), electrochromic (smart) windows, electrochromic displays, back lights, batteries, sensors, anti-radiation coatings, anti-static coatings, catalysts, electromagnetic shielding, electromechanical actuators, electronic membranes, embedded array antennas, fuel cells, infrared reflectors, photovoltaic (PV) junction devices, non-corrosive paint, non-linear optical devices, conductive paint, polymer electrolytes, capacitors, semiconductor circuits, thin film transistors (TFTs), waveguides, and wires (low current).

In order to demonstrate the improvements in the desired properties of the coatings of the present invention, direct comparisons with state-of-the-art coatings and with coatings produced from unmodified Baytron®P are made and presented herein below. Accordingly, mixtures having various concentrations of Baytron®P and D-sorbitol are prepared in accordance to U.S. Pat. No. 5,766,515 in order to produce the state-of-the-art coatings. This state-of-the-art patent is selected for comparison purposes because it is the only one that describes the invention in sufficient detail to reproduce. Coatings subsequently fabricated from these mixtures are characterized for electrical conductivity and optical transmission. Due to the variables associated with these measurements, quantitative comparison for measurements obtained using different devices and different operators can be problematic. Thus, for the purposes of exemplifying the improvements due to the use of the additives disclosed herein, the unmodified Baytron®P and the state-of-the-art coatings are compared directly with the coatings prepared from the mixtures of the present invention, with the same operator utilizing the same measurement techniques and devices to carry out the comparisons.

As the comparisons hereinbelow illustrate, the use of select, especially the preferred additives in the mixtures of the present invention, are instrumental in bringing about the desired property improvements without the need for any high temperature treatments.

In preparing the mixtures, the additives, in solid or liquid form, are mixed in with Baytron®P aqueous dispersion, and allowed to mix for several minutes with minor agitation. The additives are typically completely soluble or miscible with the Baytron®P aqueous dispersion. The resulting mixtures are subsequently coated onto a glass or plastic substrate using either a spin coating apparatus or a doctor blade. Typically, a glass substrate (about 2 inches in diameter) is mounted onto the vacuum chuck of the spin coating device. The mixture is added to the center of the substrate, and spinning is initiated. The samples are spun at 2000 revolutions per minute for a period of 10 seconds. The coatings are subsequently dried for 5 minutes at 80° C. The surface resistivity of each coating is measured. Subsequently, the coatings are treated at 200° C. for 90 seconds or 1.5 minutes. The surface resistivity of each coating is measured again to determine the effects of the heat treatment.

The thickness of each coating prepared for characterization ranges from about 100 nm to about 1000 nm; coatings having thicknesses in the range of about 100 nm to about 300 nm are preferred for use herein. The coatings are characterized for optical transparency/optical transmission, surface resistance, and volume resistivity, which is calculated using the following equation:

$$\text{Volume resistivity} = (\pi/\ln 2)(k)(t)(\text{surface resistance in ohm/square})$$

Wherein t=the coating thickness, measured in centimeters (cm), k is the geometrical correction factor. The constant k is related to the coating thickness, probe spacing and sample size.

The characterization data for coatings produced from the state-of-the-art mixtures, i.e., Baytron®P/D-sorbitol mixtures at several different concentrations, is presented in Table 1. For comparative purposes, the characterization results for the coating produced from Baytron®P dispersion without any additive (i.e., unmodified Baytron®P) is also presented in Table 1. It is concluded, from the information in Table 1 and from information in U.S. Pat. No. 5,766,515, that the most significant improvement in conductivity (i.e., lowest volume resistivity) that is exhibited by the Baytron®P/D-sorbitol mixture is achieved only after a high temperature treatment at 200° C. The high temperature treatment can be disadvantageous because it limits the substrates upon which coatings with improved electrical conductivity can be applied. In particular, certain polymeric substrates, such as bisphenol A polycarbonate (PC) and poly(ethylene terephthalate) (PET), cannot be used with this state-of-the-art mixture for the very reason. Both PC and PET have thermal stabilities far below 200° C., as measured by their glass transition temperatures. For many conductive coating applications, it is desirable to coat inexpensive plastic substrates, such as PET and PC, in a continuous, rapid and automated process.

TABLE 1

Baytron ® P/D-Sorbitol Coating Characterization on Glass

| Mixture Baytron ® P: D-Sorbitol | Thickness (nm) | Surface Resistivity (k-ohm/square) | pH | Volume Resistivity (ohm · cm) | Drying Conditions |
|---|---|---|---|---|---|
| 1:1 | 190 | 105 | 2 | 37.9 | RT, 12 hr |
| 1:2 | 210 | 112 | 2 | 44.6 | RT, 12 hr |
| 1:6 | 240 | 53 | 2 | 24.1 | RT, 4 hr |
| 1:12 | 260 | 52 | 2 | 25.7 | RT, 12 hr |
| 1:1 | 190 | 65 | 2 | 23.4 | 200° C., 1.5 min |
| 1:12 | 260 | 13.4 | 2 | 6.6 | 200° C., 1.5 min |

| Mixture Unmodified Baytron ® P | Thickness (nm) | Surface Resistivity (k-ohm/square) | pH | Volume Resistivity (ohm · cm) | Drying Conditions |
|---|---|---|---|---|---|
| 1:0 | 85 | 160 | 2 | 26.0 | 80° C., 5 min |

RT = room temperature, about 23° C.

Achieving volume resistivities of less than 0.3 ohm·cm, down to 0.037 when dried at only 80° C. for 5 minutes, represent a major improvement as compared to the volume resistivities of unmodified Baytron®P coatings (two orders of magnitude improvement) and of the Baytron®P/D-sorbitol coatings (1–2 orders of magnitude improvement). Even compared to the Baytron®P/D-sorbitol coating that is shock-dried at 200° C. and that yields the best results of all state-of-the-art-art coatings, the coatings of the present invention still exhibit greater than a twenty-fold reduction in volume resistivity. This improvement in conductivity is achieved with no sacrifice in optical transparency. The use of the additives described herein, in combination with the significant reduction in temperature treatment, provide for coatings (of the present invention) with a significant advantage over the state-of-the-art coatings.

TABLE 2

Baytron ® P/2,2-Dimethyl-1,3-Dioxolane Coating Characterization on Glass

| Mixture Baytron ® P: 2,2-Dimethyl-1,3-Dioxolane | Thickness (nm) | Surface Resistivity (k-ohm/square) | pH | Volume Resistivity (ohm · cm) | Drying Conditions |
|---|---|---|---|---|---|
| 1:1 | 160 | 8.9 | 2 | 2.70 | 80° C., 5 min |
| 1:6 | 160 | 0.67 | 2 | 0.20 | 80° C., 5 min |
| 1:10 | 150 | 0.65 | 2 | 0.18 | 80° C., 5 min |
| 1:20 | 150 | 0.52 | 2 | 0.15 | 80° C., 5 min |
| 1:50 | 150 | 7.6 | 2 | 2.16 | 80° C., 5 min |

Coatings produced from Baytron®P/2,2-Dimethyl-1,3-dioxolane mixtures provide a significant improvement in electrical conductivity relative to the unmodified Baytron®P and Baytron®P/D-sorbitol coatings. This improvement is achieved with considerably lower drying temperatures. Based on solids content, the concentrations of the components are 1 part Baytron®P and between 6 and 20 parts 2,2-dimethyl-1,3-dioxolane. The relevant data is presented in Table 2. Further heating of these coatings, to 200° C. for 1.5 minutes, provides no significant enhancement in electrical conductivity. Coatings produced from Baytron®P/cyclohexanone ethylene ketal mixtures provide a significant improvement in electrical conductivity even when a lower temperature drying cycle is utilized. Based on solids content, the concentrations of the components are 1 part Baytron®P and 10 parts cyclohexanone ethylene ketal. The relevant data is presented in Table 3. Further heating of these coatings, to 200° C. for 1.5 minutes, provides no significant enhancement in electrical conductivity.

TABLE 3

Baytron ® P/Cyclohexanone Ethylene Ketal Coating Characterization on Glass

| Mixture Baytron ® P: Cyclohexanone Ethylene Ketal | Thickness (nm) | Surface Resistivity (k-ohm/square) | pH | Volume Resistivity (ohm · cm) | Drying Conditions |
|---|---|---|---|---|---|
| 1:1 | 180 | 44.2 | 2 | 15.06 | 80° C., 5 min |
| 1:10 | 150 | 0.89 | 2 | 0.25 | 80° C., 5 min |

Coatings produced from Baytron®P/cyclohexanedione mono ethylene ketal mixtures, at 1:1 and 1:6 Baytron®P to cyclohexanedione mono ethylene ketal concentrations, also provide a significant improvement in electrical conductivity. The relevant data is presented in Table 4. Heating of these Baytron®P/cyclohexanedione mono ethylene ketal coatings, to 200° C. for 1.5 minutes, provides only a slight enhancement in electrical conductivity. For example, the first entry in Table 4 shows a reduction in volume resistivity from 0.96 to 0.69 after this thermal treatment.

TABLE 4

Baytron ® P/Cyclohexanedione Mono Ethylene Ketal Coating Characterization on Glass

| Mixture Baytron ® P: Cyclohexanedione Mono Ethylene Ketal | Thickness (nm) | Surface Resistivity (k-ohm/square) | pH | Volume Resistivity (ohm · cm) | Drying Conditions |
|---|---|---|---|---|---|
| 1:1 | 280 | 1.8 | 2 | 0.96 | 80° C., 5 min |
| 1:6 | 280 | 2.82 | 2 | 1.50 | 80° C., 5 min |

Coatings produced from Baytron®P/2,2-dimethyl-3-methylhydroxy-1,3-dioxolane mixtures, preferably having Baytron®P:2,2-dimethyl-3-methylhydroxy-1,3-dioxolane concentrations of about 1:6 to about 1:20, provide a significant improvement in electrical conductivity. The relevant data is presented in Table 5. Further heat treatment of these coatings, for 1.5 minutes at 200° C., provides no improvement in electrical conductivity.

All coatings produced from Baytron®P/:cyclic aliphatic ketal mixtures exhibit optical transparencies similar to that of Baytron®P/D-sorbitol coatings and unmodified Baytron®P coatings.

TABLE 5

Baytron ® P/2,2-Dimethyl-3-Methylhydroxy-1,3-Dioxolane Coating Characterization on Glass

| Mixture Baytron ® P: 2,2-Dimethyl-3-Methylhydroxy-1,3-Dioxolane | Thickness (nm) | Surface Resistivity (k-ohm/square) | pH | Volume Resistivity (ohm · cm) | Drying Conditions |
|---|---|---|---|---|---|
| 1:1 | 150 | 20.1 | 2 | 5.72 | 80° C., 5 min |
| 1:6 | 170 | 1.69 | 2 | 0.54 | 80° C., 5 min |
| 1:10 | 180 | 1.01 | 2 | 0.345 | 80° C., 5 min |
| 1:20 | 150 | 0.86 | 2 | 0.245 | 80° C., 5 min |
| 1:100 | 90 | 32.5 | 2 | 5.55 | 80° C., 5 min |

Regarding the cyclo-aliphatic lactone class of additives, the characterization data for coatings produced from Baytron®P/Δ-valerolactone, Baytron®P/ε-caprolactone, and Baytron®P/γ-butyrolactone mixtures are presented in Tables 6, 7 and 8, respectively.

For Δ-valerolactone, the preferred concentration range is from about 1:1 to about 2:1, with the range of about 1:1 to about 1:50 providing the greatest improvement in electrical conductivity. Further heating of these coatings, to 200° C. for 1.5 minutes, provides no additional improvement in electrical conductivity.

TABLE 6

Baytron ® P/Δ-Valerolactone Coating Characterization on Glass

| Mixture Baytron ® P: Δ-Valerolactone | Thickness (nm) | Surface Resistivity (k-ohm/square) | pH | Volume Resistivity (ohm · cm) | Drying Conditions |
|---|---|---|---|---|---|
| 1:1 | 150 | 2.42 | 2 | 0.69 | 80° C., 5 min |
| 1:6 | 130 | 1.54 | 2 | 0.38 | 80° C., 5 min |
| 1:10 | 130 | 1.71 | 2 | 0.42 | 80° C., 5 min |
| 1:50 | 120 | 3.1 | 2 | 0.71 | 80° C., 5 min |
| 1:100 | 120 | 10.8 | 2 | 2.46 | 80° C., 5 min |
| 2:1 | 160 | 17.5 | 2 | 5.31 | 80° C., 5 min |

For ε-caprolactone, the preferred concentration range is from about 1:1 to about 1:100 Baytron®P to ε-caprolactone. The concentration of 2:1 Baytron®P to ε-caprolactone also provides some improvement. The best results are obtained from the concentration range of about 1:1 to about 1:50. Additional heating of these coatings, to 200° C. for 1.5 minutes, provides no significant increase in electrical conductivity.

TABLE 7

Baytron ® P/ε-Caprolactone Coating Characterization on Glass

| Mixture Baytron ® P: ε-Caprolactone | Thickness (nm) | Surface Resistivity (k-ohm/square) | pH | Volume Resistivity (ohm · cm) | Drying Conditions |
|---|---|---|---|---|---|
| 1:1 | 180 | 1.55 | 2 | 0.53 | 80° C., 5 min |

TABLE 7-continued

Baytron ® P/ε-Caprolactone Coating Characterization on Glass

| Mixture Baytron ® P: ε-Caprolactone | Thickness (nm) | Surface Resistivity (k-ohm/square) | pH | Volume Resistivity (ohm · cm) | Drying Conditions |
|---|---|---|---|---|---|
| 1:6 | 180 | 1.42 | 2 | 0.48 | 80° C., 5 min |
| 1:10 | 170 | 1.3 | 2 | 0.42 | 80° C., 5 min |
| 1:50 | 140 | 2.6 | 2 | 0.69 | 80° C., 5 min |
| 1:100 | 120 | 8.3 | 2 | 1.89 | 80° C., 5 min |
| 2:1 | 180 | 14.3 | 2 | 4.89 | 80° C., 5 min |

For γ-butyrolactone, the preferred concentration range of Baytron®P to γ-butyrolactone is in the range from about 1:1 to about 1:100. Some improvement in electrical conductivity is also realized with the 2:1 concentration. The most preferred concentration range is from about 1:1 to about 1:50. The subsequent heating of these coatings, to 200° C. for 1.5 minutes, provides no significant increase in electrical conductivity.

TABLE 8

Baytron ® P/γ-Butyrolactone Coating Characterization on Glass

| Mixture Baytron ® P: γ-Butyrolactone | Thickness (nm) | Surface Resistivity (k-ohm/square) | pH | Volume Resistivity (ohm · cm) | Drying Conditions |
|---|---|---|---|---|---|
| 1:1 | 200 | 1.13 | 2 | 0.43 | 80° C., 5 min |
| 1:6 | 180 | 1.31 | 2 | 0.45 | 80° C., 5 min |
| 1:10 | 180 | 1.5 | 2 | 0.51 | 80° C., 5 min |
| 1:50 | 150 | 2.8 | 2 | 0.80 | 80° C., 5 min |
| 1:100 | 130 | 8.8 | 2 | 2.17 | 80° C., 5 min |
| 2:1 | 180 | 36.4 | 2 | 12.43 | 80° C., 5 min |

All coatings produced from Baytron®P:cyclic aliphatic lactone mixtures exhibit optical transparencies similar to that of Baytron®P/D-sorbitol coatings and unmodified Baytron®P coatings.

Regarding the cyclo aliphatic carbonate class of additives, coatings produced from Baytron®P/ethylene carbonate mixtures are characterized. The characterization data for these coatings are presented in Table 9. The preferred concentration range of this additive is the range from about 1:1 to about 1:50 Baytron®P to ethylene carbonate. This entire concentration range provides a significant improvement in electrical conductivity. Further heating of these coatings, to 200° C. for 1.5 minutes, provides no significant improvement in electrical conductivity.

TABLE 9

Baytron ® P/Ethylene Carbonate Coating Characterization on Glass

| Mixture Baytron ® P: Ethylene Carbonate | Thickness (nm) | Surface Resistivity (k-ohm/square) | pH | Volume Resistivity (ohm · cm) | Drying Conditions |
|---|---|---|---|---|---|
| 1:1 | 130 | 1.81 | 2 | 0.45 | 80° C., 5 min |
| 1:6 | 180 | 1.33 | 2 | 0.45 | 80° C., 5 min |
| 1:10 | 190 | 1.28 | 2 | 0.46 | 80° C., 5 min |
| 1:50 | 190 | 2.53 | 2 | 0.91 | 80° C., 5 min |
| 2:1 | 170 | 55.0 | 2 | 17.74 | 80° C., 5 min |

All coatings produced from Baytron®P:ethylene carbonate mixtures exhibit optical transparencies similar to that of Baytron®P:D-sorbitol coatings and unmodified Baytron®P coatings.

Regarding the cyclic-oxide class of additives, coatings prepared from Baytron®P/styrene oxide and Baytron®P/glycidol mixtures are characterized. Characterization data for these coatings is presented in Tables 10 and 11, respectively.

For the styrene oxide containing coatings, concentrations of 1:10 (Baytron®P to styrene oxide) does not provide homogenous solutions. The most preferred concentration is 1:1 because it provides the greatest improvement in electrical conductivity of the cyclic oxide class. Further drying of the 1:1 coating, at 200° C. for 1.5 minutes; does not improve their electrical conductivity.

TABLE 10

Baytron ® P/Styrene Oxide Coating Characterization on Glass

| Mixture Baytron ® P: Styrene Oxide | Thickness (nm) | Surface Resistivity (k-ohm/square) | pH | Volume Resistivity (ohm · cm) | Drying Conditions |
|---|---|---|---|---|---|
| 1:1 | 190 | 0.34 | 2 | 0.12 | 80° C., 5 min |

For the glycidol coatings, concentrations of about 1:1 to about 1:100 (Baytron®P to glycidol) are preferred, with the more preferred concentration range being from about 1:1 to about 1:10. Further drying of these coatings, at 200° C. for 1.5 minutes, does not improve their electrical conductivity.

TABLE 11

Baytron ® P/Glycidol Coating Characterization on Glass

| Mixture Baytron ® P: Glycidol | Thickness (nm) | Surface Resistivity (k-ohm/square) | pH | Volume Resistivity (ohm · cm) | Drying Conditions |
|---|---|---|---|---|---|
| 1:1 | 180 | 2.1 | 2 | 0.72 | 80° C., 5 min |
| 1:10 | 180 | 1.55 | 3–4 | 0.53 | 80° C., 5 min |
| 1:100 | 130 | 14.6 | 5 | 3.602 | 80° C., 5 min |

All coatings produced from Baytron®P:cyclic oxide mixtures exhibit optical transparencies similar to that of Baytron®P:D-sorbitol coatings and unmodified Baytron®P coatings.

Regarding the cyclic diketone class of additives, coatings prepared from Baytron®P/ninhydrin mixtures are characterized. Characterization data for these Baytron®P/ninhydrin coatings is presented in Table 12. The concentrations of about 1:1 to about 1:6 and 2:1 (Baytron®P to ninhydrin) are preferred as they yield significant improvements in electrical conductivity. Further drying of these coatings, at 200° C. for 1.5 minutes, does not improve their electrical conductivity.

The coatings produced from Baytron®P/ninhydrin mixtures exhibit optical transparencies similar to that of Baytron®P/D-sorbitol coatings and unmodified Baytron®P coatings.

TABLE 12

Baytron ® P/Ninhydrin Coating Characterization on Glass

| Mixture Baytron ® P: Ninhydrin | Thickness (nm) | Surface Resistivity (k-ohm/square) | pH | Volume Resistivity (ohm · cm) | Drying Conditions |
|---|---|---|---|---|---|
| 1:1 | 200 | 0.65 | 2 | 0.25 | 80° C., 5 min |
| 1:6 | 190 | 0.7 | 2 | 0.25 | 80° C., 5 min |
| 2:1 | 170 | 1.1 | 2 | 0.35 | 80° C., 5 min |

Regarding the anhydride class of additives (cyclic and linear), coatings produced from Baytron®P/maleic anhydride, Baytron®P/phthalic anhydride, and Baytron®P/acetic anhydride mixtures are characterized. Characterization data for these coatings is presented in Tables 13, 14 and 15, respectively.

For maleic anhydride, the preferred concentrations of Baytron®P to maleic anhydride is from about 1:1 to about 1:6 and 2:1. Coatings prepared from these mixtures provide significant improvement in electrical conductivity. However, the concentration of 1:6 (Baytron®P to maleic anhydride) yields the most significant improvement. As is the case with nearly all of the additives described herein, heat treatment of these coatings, at 200° C. for 1.5 minutes, does not significantly change the electrical conductivity of these coating.

TABLE 13

Baytron ® P/Maleic Anhydride Coating Characterization on Glass

| Mixture Baytron ® P: Maleic Anhydride | Thickness (nm) | Surface Resistivity (k-ohm/square) | pH | Volume Resistivity (ohm · cm) | Drying Conditions |
|---|---|---|---|---|---|
| 1:1 | 180 | 1.6 | 2 | 0.55 | RT, 2 hr 80° C., 5 min |
| 1:2 | 180 | 1.7 | 2 | 0.60 | 80° C., 5 min |
| 1:6 | 180 | 0.5 | 2 | 0.17 | 80° C., 5 min |
| 2:1 | 160 | 2.46 | 2 | 0.75 | 80° C., 5 min |

For phthalic anhydride, the preferred concentration is about 1:1 (Baytron®P to phthalic anhydride). Further heat treatment of these coatings, at 200° C. for 1.5 minutes, does not significantly change the electrical conductivity.

TABLE 14

Baytron ® P/Phthalic Anhydride Coating Characterization on Glass

| Mixture Baytron ® P: Phthalic Anhydride | Thickness (nm) | Surface Resistivity, (k-ohm/square) | pH | Volume Resistivity, ohm · cm | Drying Conditions |
|---|---|---|---|---|---|
| 1:1 | 180 | 1.96 | 2 | 0.67 | 80° C., 5 min |

For acetic anhydride, the preferred concentration of the Baytron®P/acetic anhydride coatings range from about 1:1 to about 1:100, with the most preferred concentration range being from about 1:6 to about 1:100. Heat treatment of these coatings, at 200° C. for 1.5, minutes does not significantly change the electrical conductivity.

The coatings produced from Baytron®P/anhydride (cyclic and linear) mixtures exhibit optical transparencies similar to that of Baytron®P/D-sorbitol coatings and unmodified Baytron®P coatings.

TABLE 15

Baytron ® P/Acetic Anhydride Coating Characterization on Glass

| Mixture Baytron ® P: Acetic Anhydride | Thickness (nm) | Surface Resistivity (k-ohm/square) | pH | Volume Resistivity (ohm · cm) | Drying Conditions |
|---|---|---|---|---|---|
| 1:1 | 160 | 26.6 | 2 | 8.08 | 80° C., 5 min |
| 1:6 | 160 | 6.5 | 2 | 1.97 | 80° C., 5 min |
| 1:12 | 150 | 1.57 | 2 | 0.45 | 80° C., 5 min |
| 1:50 | 150 | 1.8 | 2 | 0.51 | 80° C., 5 min |
| 1:100 | 140 | 5.3 | 2 | 1.41 | 80° C., 5 min |

Regarding the aminocarbonic acid and aliphatic carbonic acid classes of additives, coatings prepared from Baytron®P/2-aminobutyric acid, Baytron®P/4-(dimethylamino)butyric acid, and Baytron®P/acetic acid mixtures are characterized. Characterization data for these coatings is presented in Tables 16, 17 and 18, respectively.

For 2-aminobutyric acid, the preferred concentration range of Baytron®P to 2-aminobutyric acid is from about 1:1 to about 1:6, with 1:6 being the most preferred. Further heating, to 200° C. for 1.5 minutes, of the 1:1 coating increases the electrical conductivity of the coating, with the volume resistivity decreasing from 2.01 ohm·cm to 0.68 ohm·cm.

TABLE 16

Baytron ® P/2-Aminobutyric Acid Coating Characterization on Glass

| Mixture Baytron ® P: 2-Aminobutyric Acid | Thickness (nm) | Surface Resistivity (k-ohm/square) | pH | Volume Resistivity (ohm · cm) | Drying Conditions |
|---|---|---|---|---|---|
| 1:1 | 180 | 5.9 | 2 | 2.01 | 80° C., 5 min |
| 1:6 | 180 | 2.2 | 2 | 0.68 | 80° C., 5 min |

For 4-(dimethylamino)butyric acid, the preferred concentration range of Baytron®P to 4-(dimethylamino)butyric acid is from about 1:1 to about 1:6, with 1:6 being the most preferred. No significant enhancement in electrical conductivity is observed after heating the coatings to 200° C. for 1.5 minutes.

TABLE 17

Baytron ® P/4-(Dimethylamino)butyric Acid Coating Characterization on Glass

| Mixture Baytron ® P: 4-(Dimethylamino) butyric Acid | Thickness (nm) | Surface Resistivity (k-ohm/square) | pH | Volume Resistivity (ohm · cm) | Drying Conditions |
|---|---|---|---|---|---|
| 1:1 | 130 | 6.6 | 2 | 1.63 | 80° C., 5 min |
| 1:6 | 140 | 2.6 | 2 | 0.69 | 80° C., 5 min |

The coatings produced from Baytron®P/aminocarbonic acid mixtures exhibit optical transparencies similar to that of Baytron®P/D-sorbitol coatings and unmodified Baytron®P coatings.

For acetic acid, the preferred concentration range for Baytron®P:acetic acid is from about 1:1 to about 1:100, with the most preferred concentration range being from about 1:12 to about 1:100. No significant enhancement in electrical conductivity is observed after heating the coatings to 200° C. for 1.5 minutes.

TABLE 18

Baytron ® P/Acetic Acid Coating Characterization on Glass

| Mixture Baytron ® P: Acetic Acid | Thickness (nm) | Surface Resistivity (k-ohm/square) | pH | Volume Resistivity (ohm · cm) | Drying Conditions |
|---|---|---|---|---|---|
| 1:1 | 150 | 78.1 | 2 | 22.23 | 80° C., 5 min |
| 1:6 | 160 | 11.0 | 2 | 3.34 | 80° C., 5 min |
| 1:12 | 130 | 3 | 2 | 0.74 | 80° C., 5 min |
| 1:50 | 130 | 4.8 | 2 | 1.18 | 80° C., 5 min |
| 1:100 | 130 | 4.7 | 2 | 1.16 | 80° C., 5 min |

The coatings produced from Baytron®P/acetic acid mixtures exhibit optical transparencies similar to that of Baytron®P/D-sorbitol coatings and unmodified Baytron®P coatings.

Regarding the phenol class of additives, coatings prepared from Baytron®P/phenol mixtures are characterized. Characterization data for these coatings is presented in Table 19. The preferred concentration range of Baytron®P to phenol is from about 1:1 to about 1:4. This class of additives yields highly favorable results. Drying these coatings for 1.5 minutes at 200° C. provides a slight improvement in conductivity. These coatings exhibit optical transparencies similar to that of Baytron®P/D-sorbitol coatings and unmodified Baytron®P coatings.

TABLE 19

Baytron ® P/Phenol Coating Characterization on Glass

| Mixture Baytron ® P: Phenol | Thickness (nm) | Surface Resistivity (k-ohm/square) | pH | Volume Resistivity (ohm · cm) | Drying Conditions |
|---|---|---|---|---|---|
| 1:1 | 190 | 0.68 | 2 | 0.27 | 80° C., 5 min |
| 1:2 | 210 | 0.38 | 2 | 0.15 | 80° C., 5 min |
| 1:4 | 220 | 0.28 | 2 | 0.12 | 80° C., 5 min |
| 2:1 | 190 | 28.4 | 2 | 10.2 | 80° C., 5 min |
| 1:50 | 130 | 4.8 | 2 | 1.18 | 80° C., 5 min |
| 1:100 | 130 | 4.7 | 2 | 1.16 | 80° C., 5 min |

For 4-hydroxyphenol (hydroquinone), another phenol, coatings produced from Baytron®P/4-hydroxyphenol mixtures are characterized. Characterization data for these coatings is presented in Table 20. The preferred concentration of Baytron®P to 4-hydroxyphenol is from about 1:1 to about 1:2. Drying these coatings for 1.5 minutes at 200° C. provides a slight improvement in conductivity. These coatings exhibit optical transparencies similar to that of Baytron®P/D-sorbitol coatings and unmodified Baytron®P coatings.

TABLE 20

Baytron ® P/4-Hydroxyphenol Coating Characterization on Glass

| Mixture Baytron ® P: 4-Hydroxyphenol | Thickness (nm) | Surface Resistivity (k-ohm/square) | pH | Volume Resistivity (ohm · cm) | Drying Conditions |
|---|---|---|---|---|---|
| 1:1 | 210 | 0.46 | 2 | 0.183 | 80° C., 5 min |
| 1:2 | 150 | 1.57 | 2 | 0.42 | 80° C., 5 min |

For 4-hydroxybenzene sulfonic acid, another phenol, coatings prepared from Baytron®P/4-hydroxybenzene sulfonic acid mixtures are characterized. Characterization data for these coatings is presented in Table 21. The preferred concentration of Baytron®P to 4-hydroxybenzene sulfonic acid is from about 1:1 to about 1:4. Drying these coatings for 1.5 minutes at 200° C. provides a slight improvement in conductivity. These coatings exhibit optical transparencies similar to that of Baytron®P/D-sorbitol coatings and unmodified Baytron®P coatings.

TABLE 21

Baytron ® P/4-Hydroxybenzene Sulfonic Acid Coating Characterization on Glass

| Mixture Baytron ® P: 4-Hydroxybenzene Sulfonic Acid | Thickness (nm) | Surface Resistivity (k-ohm/square) | pH | Volume Resistivity (ohm · cm) | Drying Conditions |
|---|---|---|---|---|---|
| 1:1 | 60 | 0.327 | 2 | 0.037 | 80° C., 5 min |
| 1:4 | 90 | 0.428 | 2 | 0.073 | 80° C., 5 min |

For m-cresol, another phenol, coatings produced from Baytron®P/m-cresol mixtures are characterized. Characterization data for these coatings is presented in Table 22. The preferred concentration of Baytron®P to m-cresol is from about 1:1 to about 1:6. The coatings produced from this concentration range yield excellent results. Thus, it is conceivable that both higher and lower amounts of m-cresol would yield comparable results. Drying these coatings for 1.5 minutes at 200° C. provides no significant improvement in conductivity. These coatings exhibit optical transparencies similar to that of Baytron®P/D-sorbitol coatings and unmodified Baytron®P coatings.

TABLE 22

Baytron ® P/m-Cresol Coating Characterization on Glass

| Mixture Baytron ® P: m-Cresol | Thickness (nm) | Surface Resistivity (k-ohm/square) | pH | Volume Resistivity (ohm · cm) | Drying Conditions |
|---|---|---|---|---|---|
| 1:1 | 100 | 0.336 | 2 | 0.064 | 80° C., 5 min |
| 1:4 | 100 | 0.354 | 2 | 0.067 | 80° C., 5 min |
| 1:6 | 100 | 0.38 | 2 | 0.072 | 80° C., 5 min |

Regarding the inorganic acids class of additives, coatings prepared from Baytron®P/phosphoric acid mixtures are characterized. Characterization data for these coatings is presented in Table 22. The highly preferred concentration range of Baytron®P to phosphoric acid is from about 1:1 to about 1:10; coatings produced from mixtures in this concentration range yield excellent results. Drying these coatings for 1.5 minutes at 200° C. provides no improvement in conductivity. These coatings exhibit optical transparencies similar to that of Baytron®P/D-sorbitol coatings and unmodified Baytron®P coatings.

TABLE 23

Baytron ® P/Phosphoric Acid Coating Characterization on Glass

| Mixture Baytron ® P: Phosphoric Acid | Thickness (nm) | Surface Resistivity (k-ohm/square) | pH | Volume Resistivity (ohm · cm) | Drying Conditions |
|---|---|---|---|---|---|
| 1:1 | 160 | 0.58 | 2 | 0.176 | 80° C.,5 min |
| 1:6 | 160 | 0.62 | 2 | 0.188 | 80° C.,5 min |
| 1:10 | 150 | 0.70 | 2 | 0.199 | 80° C.,5 min |

The surface resistance (in Mega ohms/square) of multiple representative Baytron®P coatings is presented in FIG. 2. These coatings are each prepared on a PC substrate that has been treated with a surface primer to aid in wetting. The coatings are subsequently dried for 5 minutes at 80° C. and their surface resistance is measured. As demonstrated herein, the reproducibility of this data is good, with the surface resistance ranging from 2.8 to 3.6 Mega ohms/square. The effect of higher temperature treatment is presented in FIG. 3. These coatings exhibit a minor decrease in surface resistance after two drying cycles, and a more significant decrease after heating at 200° C. for 1.5 minutes.

In order to demonstrate the improved conductivity (i.e., reduction in surface resistance) of the coatings produced from the mixtures of the present invention, relative to the Baytron®P coatings illustrated in FIGS. 2 and 3, Baytron®P/γ-butyrolactone (at a concentration of 1:2) coatings are prepared in the same manner and at the same thickness on a pretreated (with the same primer and dried for 5 minutes at 80° C.) PC substrate. The results for multiple repetitions are presented in FIG. 4. The decrease in surface resistance due to the use γ-butyrolactone is very significant because the drop from about 3 Mega ohms/square to about 0.67 kilo ohms/square represents a reduction of over 3000 fold. This effect appears to be independent of the substrate as it has been demonstrated on glass (see, Table 8) and plastic (see, FIGS. 4 and 5) substrates.

The results of the effect of various drying conditions on the surface resistance of the Baytron®P/γ-butyrolactone coating are presented in FIG. 5. The same drying conditions as used for the unmodified Baytron®P coatings are utilized (see FIG. 3). The Baytron®P/γ-butyrolactone coatings do not exhibit a significant change in surface resistance, as compared to the coatings presented in FIG. 3, due to the high temperature treatment.

EXAMPLES

Having generally described the invention, a more complete understanding thereof can be obtained by reference to the following examples that are provided for purposes of illustration only and do not limit the invention.

Example 1

Preparation of Comparative Example of Baytron®P/D-Sorbitol Coatings

Four different concentrations of Baytron®P/D-sorbitol aqueous mixtures were prepared, in accordance to U.S. Pat. No. 5,766,515, by adding the appropriate amount of D-sorbitol to Baytron®P aqueous dispersion. The D-sorbitol was added as a solid and mixed for several minutes at room temperature. The Baytron®P:D-sorbitol mixtures were prepared at concentrations of 1:1, 1:2, 1:6 and 1:12 by weight.

The following procedures were followed for each of the examples described herein (i.e., Examples 1–23). The concentration of each component in the mixture is based on the amount of poly(3,4-ethylenedioxy)thiophene/PSS in the Baytron®P dispersion and the selected ratio of the components. The acidity of the resulting mixture is measured using pH indicator paper. The mixture is subsequently used to produce thin coatings via a spin casting technique. The coatings are dried under different conditions. The surface resistivity, in ohms/square, of each coating is measured using a Keithley™ 2000 four-point probe according to ASTM standards. The thickness of each coating is measured with a stylus (Dek Tek I™). The volume resistivity of each coating is calculated using the following equation:

Volume resistivity=$(\pi/\ln 2)(k)(t)$(surface resistance in ohm/square)

Wherein t=the coating thickness, measured in centimeters (cm), k=the geometrical correction factor. The constant k is related to the coating thickness, probe spacing and sample size. The optical transmission of the coatings are determined using a UV-Vis near IR spectrophotometer (Varian™ Model 2200). In some cases, optical transmission is determined using a BYK Gardner Haze-Gard Plus™ instrument.

The coatings are treated at 200° C. for 90 seconds or 1.5 minutes. The surface resistivity of each coating is measured before and after this high temperature treatment to determine the effects of the heat treatment.

The relevant data for this example is presented in Table 1 hereinabove.

Example 2

Preparation of Baytron®P/2,2-Dimethyl-1,3-Dioxolane Coatings

Five different concentrations of Baytron®P/2,2-dimethyl-1,3-dioxolane aqueous mixtures were prepared by adding the appropriate amount of 2,2-dimethyl-1,3-dioxolane to Baytron®P aqueous dispersion. The 2,2-dimethyl-1,3-dioxolane was added dropwise, and mixed for several minutes at room temperature. The Baytron®P:2,2-dimethyl-1,3-dioxolane mixtures were prepared at concentrations of 1:1, 1:6, 1:10, 1:20 and 1:50 by weight.

The relevant data for this example is presented in Table 2 hereinabove.

Example 3

Preparation of Baytron®P/Cyclohexanone Ethylene Ketal Coatings

Two different concentrations of Baytron®P/cyclohexanone ethylene ketal aqueous mixtures were prepared by adding the appropriate amount of cyclohexanone ethylene ketal to Baytron®P aqueous dispersion. The cyclohexanone ethylene ketal was added dropwise, and mixed for several minutes at room temperature. The Baytron®P: cyclohexanone ethylene ketal mixtures were prepared at concentrations of 1:1 and 1:10 by weight.

The relevant data for this example is presented in Table 3 hereinabove.

Example 4

Preparation of Baytron®P/Cyclohexanedione Mono Ethylene Ketal Coatings

Two different concentrations of Baytron®P/cyclohexanedione mono ethylene ketal aqueous mixtures were prepared by adding the appropriate amount of cyclohexanedione mono ethylene ketal to Baytron®P aqueous dispersion. The cyclohexanedione mono ethylene ketal was added dropwise, and mixed for several minutes at room temperature. The Baytron®P:cyclohexanedione mono ethylene ketal mixtures were prepared at concentrations of 1:1 and 1:6 by weight.

The relevant data for this example is presented in Table 4 hereinabove.

Example 5

Preparation of 2,2-Dimethyl-3-Methylhydroxy-1,3-Dioxolane Coatings

Five different concentrations of Baytron®P/2,2-dimethyl-3-methylhydroxy-1,3-dioxolane aqueous mixtures were prepared by adding the appropriate amount of 2,2-dimethyl-3-methylhydroxy-1,3-dioxolane to Baytron®P aqueous dispersion. The 2,2-dimethyl-3-methylhydroxy-1,3-dioxolane was added dropwise and mixed for several minutes at room temperature. The Baytron®P:2,2-dimethyl-3-methylhydroxy-1,3-dioxolane mixtures were prepared at concentrations of 1:1, 1:6, 1:10, 1:20 and 1:100 by weight.

The relevant data for this example is presented in Table 5 hereinabove.

Example 6

Preparation of Baytron®P/Δ-Valerolactone Coatings

Six different concentrations of Baytron®P/Δ-valerolactone aqueous mixtures were prepared by adding the appropriate amount of Δ-valerolactone to Baytron®P aqueous dispersion. The Δ-valerolactone was added dropwise, and mixed for several minutes at room temperature. The Baytron®P:Δ-valerolactone mixtures were prepared at concentrations of 1:1, 1:6, 1:10, 1:50, 1:100 and 2:1 by weight.

The relevant data for this example is presented in Table 6 hereinabove.

Example 7

Preparation of Baytron®P/ε-Caprolactone Coatings

Six different concentrations of Baytron®P/ε-caprolactone aqueous mixtures were prepared by adding the appropriate amount of ε-caprolactone to Baytron®P aqueous dispersion. The ε-caprolactone was added dropwise, and mixed for several minutes at room temperature. The Baytron®P:ε-caprolactone mixtures were prepared at concentrations of 1:1, 1:6, 1:10, 1:50, 1:100 and 2:1 by weight The relevant data for this example is presented in Table 7 hereinabove.

Example 8

Preparation of Baytron®P/γ-Butyrolactone Coatings

Six different concentrations of Baytron®P/γ-Butyrolactone aqueous mixtures were prepared by adding the appropriate amount of γ-butyrolactone to Baytron®P aqueous dispersion. The γ-butyrolactone was added dropwise, and mixed for several minutes at room temperature. The Baytron®P:γ-butyrolactone mixtures were prepared at concentrations of 1:1, 1:6, 1:10, 1:50, 1:100 and 2:1 by weight.

The relevant data for this example is presented in Table 8 hereinabove.

Example 9

Preparation of Baytron®P/Ethylene Carbonate Coatings

Five different concentrations of Baytron®P/ethylene carbonate aqueous mixtures were prepared by adding the appropriate amount of ethylene carbonate to Baytron®P aqueous dispersion. The ethylene carbonate was added as a solid and mixed for several minutes at room temperature. The Baytron®P:ethylene carbonate mixtures were prepared at concentrations of 1:1, 1:6, 1:10, 1:50 and 2:1 by weight.

The relevant data for this example is presented in Table 9 hereinabove.

Example 10

Preparation of Baytron®P/Styrene Oxide Coating

One concentration of Baytron®P/styrene oxide aqueous mixtures was prepared by adding the appropriate amount of styrene oxide to Baytron®P aqueous dispersion. The styrene oxide was added dropwise, and mixed for several minutes at room temperature. The Baytron®P:styrene oxide mixtures were prepared at concentrations of 1:1 by weight.

The relevant data for this example is presented in Table 10 hereinabove.

Example 11

Preparation of Baytron®P/Glycidol Coatings

Three different concentrations of Baytron®P/glycidol aqueous mixtures were prepared by adding the appropriate amount of glycidol to Baytron®P aqueous dispersion. The glycidol was added dropwise, and mixed for several minutes at room temperature. The Baytron®P:glycidol mixtures were prepared at concentrations of 1:1, 1:10 and 1:100 by weight.

The relevant data for this example is presented in Table 11 hereinabove.

Example 12

Preparation of Baytron®P/Ninhydrin Coatings

Three different concentrations of Baytron®P/ninhydrin aqueous mixtures were prepared by adding the appropriate amount of ninhydrin to Baytron®P aqueous dispersion. The ninhydrin was added as a solid and mixed for several minutes at room temperature. The Baytron®P:ninhydrin mixtures were prepared at concentrations of 1:1, 1:6 and 2:1 by weight.

The relevant data for this example is presented in Table 12 hereinabove.

Example 13

Preparation of Baytron®P/Maleic Anhydride Coatings

Four different concentrations of Baytron®P/maleic anhydride aqueous mixtures were prepared by adding the appropriate amount of maleic anhydride to Baytron®P aqueous dispersion. The maleic anhydride was added as a solid and mixed for several minutes at room temperature. The Baytron®P:maleic anhydride mixtures were prepared at concentrations of 1:1, 1:2, 1:6 and 2:1 by weight.

The relevant data for this example is presented in Table 13 hereinabove.

Example 14

Preparation of Baytron®P/Phthalic Anhydride Coatings

One concentration of Baytron®P/phthalic anhydride aqueous mixture was prepared by adding the appropriate amount of phthalic anhydride to Baytron®P aqueous dispersion. The phthalic anhydride was added as a solid and mixed for several minutes at room temperature. The Baytron®P:phthalic anhydride mixture was prepared at a concentration of 1:1 by weight.

The relevant data for this example is presented in Table 14 hereinabove.

Example 15

Preparation of Baytron®P/Acetic Anhydride Coatings

Five different concentrations of Baytron®P/acetic anhydride aqueous mixtures were prepared by adding the appropriate amount of acetic anhydride to Baytron®P aqueous dispersion. The acetic anhydride was added dropwise, and mixed for several minutes at room temperature. The Baytron®P:acetic anhydride mixtures were prepared at concentrations of 1:1, 1:6, 1:12, 1:50 and 1:100 by weight.

The relevant data for this example is presented in Table 15 hereinabove.

Example 16

Preparation of Baytron® P/Aminobutyric Acid Coatings

Two different concentrations of Baytron®P/aminobutyric acid aqueous mixtures were prepared by adding the appropriate amount of aminobutyric acid to Baytron®P aqueous dispersion. The aminobutyric acid was added as a solid and mixed for several minutes at room temperature. The Baytron®P:aminobutyric acid mixtures were prepared at concentrations of 1:1 and 1:6 by weight.

The relevant data for this example is presented in Table 16 hereinabove.

Example 17

Preparation of Baytron®P/4-(Dimethylamino)butyric Acid Coatings

Two different concentrations of Baytron®P/4-(dimethylamino)butyric acid aqueous mixtures were prepared by adding the appropriate amount of 4-(dimethylamino)butyric acid to Baytron®P aqueous dispersion. The 4-(dimethylamino)butyric acid was added as a solid and mixed for several minutes at room temperature. The Baytron®P:4-(dimethylamino)butyric acid mixtures were prepared at concentrations of 1:1 and 1:6 by weight.

The relevant data for this example is presented in Table 17 hereinabove.

Example 18

Preparation of Baytron®P/Acetic Acid Coatings

Five different concentrations of Baytron®P/acetic acid aqueous mixtures were prepared by adding the appropriate amount of acetic acid to Baytron®P aqueous dispersion. The acetic acid was added dropwise, and mixed for several minutes at room temperature. The Baytron®P:acetic acid mixtures were prepared at concentrations of 1:1, 1:6, 1:12, 1:50 and 1:100 by weight.

The relevant data for this example is presented in Table 18 hereinabove.

Example 19

Preparation of Baytron®P/Phenol Coatings

Six different concentrations of Baytron®P/phenol aqueous mixtures were prepared by adding the appropriate amount of phenol to Baytron®P aqueous dispersion. The phenol was added as a solid and mixed for several minutes at room temperature. The Baytron®P:phenol mixtures were prepared at concentrations of 1:1, 1:2, 1:4, 1:50, 1:100 and 2:1 by weight.

The relevant data for this example is presented in Table 19 hereinabove.

Example 20

Preparation of Baytron®P/4-Hydroxypheonol Coatings

Two different concentrations of Baytron®P/4-hydroxypheonol aqueous mixtures were prepared by adding the appropriate amount of 4-hydroxypheonol to Baytron®P aqueous dispersion. The 4-hydroxypheonol was added as a solid and mixed for several minutes at room temperature. The Baytron®P:4-hydroxypheonol mixtures were prepared at concentrations of 1:1 and 1:2 by weight.

The relevant data for this example is presented in Table 20 hereinabove.

Example 21

Preparation of Baytron®P/4-Hydroxybenzene Sulfonic Acid Coatings

Two different concentrations of Baytron®P/4-hydroxybenzene sulfonic acid aqueous mixtures were prepared by adding the appropriate amount of 4-hydroxysulfonic acid to Baytron®P aqueous dispersion. The 4-hydroxybenzene sulfonic acid was added as a solid and mixed for several minutes at room temperature. The Baytron®P 4-hydroxybenzene sulfonic acid mixtures were prepared at concentrations of 1:1 and 1:4 by weight.

The relevant data for this example is presented in Table 21 hereinabove.

Example 22

Preparation of Baytron®P/m-Cresol Coatings

Three different concentrations of Baytron®P/m-cresol aqueous mixtures were prepared by adding the appropriate amount of m-cresol to Baytron®P aqueous dispersion. The m-cresol was added dropwise, and mixed for several minutes at room temperature. The Baytron®P:m-cresol mixtures were prepared at concentrations of 1:1, 1:4 and 1:6 by weight.

The relevant data for this example is presented in Table 22 hereinabove.

Example 23

Preparation of Baytron®P/Phosphoric Acid Coatings

Three different concentrations of Baytron®P/phosphoric acid aqueous mixtures were prepared by adding the appropriate amount of phosphoric acid to Baytron®P aqueous dispersion. The phosphoric acid was added dropwise, and mixed for several minutes at room temperature. The Baytron®P:phosphoric acid mixtures were prepared at concentrations of 1:1, 1:6 and 1:10 by weight.

The relevant data for this example is presented in Table 23 hereinabove.

As noted above, the present invention pertains to aqueous thiophene/anion dispersions comprising additives, and coatings and applications related thereto. The present invention should not be considered limited to the particular examples described above, but rather should be understood to cover all aspects of the invention as fairly set out in the appended claims. Various modifications, equivalent processes, as well as numerous structures to which the present invention may be applicable will be readily apparent to those of skill in the art to which the present invention is directed upon review of the present specification.

What is claimed is:

1. A composition comprising:
   a mixture of (A) a dispersion consisting essentially of an oliogmer, dendrimer or polymer containing thiophene groups in a cationic form with an anionic compound, anionic oligomer, anionic dendrimer or anionic polymer, and water;
   (B) at least one additive that comprises one or more species of the following functional groups: ketal, lactone, carbonate, cyclic oxide, diketone, anhydride, aminocarbonic acid, carbonic acid, phenol and inorganic acid; and one or more species of the derivates of these functional groups; and
   wherein the ratio of Component A to Component B ranges from about 2:1 to about 1:100 by weight.

2. The composition of claim 1 wherein Component A is a dispersion consisting essentially of polythiophene and the polyanion of polystyrene sulfonic acid, and water.

3. The composition of claim 1 wherein Component A is a dispersion consisting essentially of poly(3,4-ethylenedioxythiophene) and the polyanion of polystyrene sulfonic acid, and water.

4. The composition of claim 1 further including a transparent substrate, the mixture applied to the surface of the transparent substrate.

5. The composition of claim 4 where the transparent substrate has a glass transition temperature below 200° C.

6. The composition of claim 1 wherein Component B is 2,2-dimethyl-1,3-dioxolane, cyclohexanone ethylene ketal, cyclohexanedione mono ethylene ketal and 2,2-dimethyl-3-methylhydroxy-1,3-dioxolane, $\Delta$-valerolactone, $\epsilon$-caprolactone and $\gamma$-butyrolactone, ethylene carbonate, styrene oxide, glycidol, ninhydrin, maleic anhydride, phthalic anhydride, acetic anhydride, 2-aminobutyric acid 4-(dimethylamino) butyric acid, acetic acid, o-cresol, m-cresol, p-cresol, phenol, 4-hydroxyphenol, 4-hydroxybenzene sulfonic acid, phosphoric acid, or any combination thereof.

7. A method for coating a transparent substrate comprising depositing on an optically transparent substrate a composition in accordance with claim 1.

8. The method according to claim 7, wherein Component A is a dispersion consisting essentially of polythiophene and the polyanion of polystyrene sulfonic acid, and water.

9. The method according to claim 7, wherein Component A is a dispersion consisting essentially of poly(3,4-ethylenedioxythiophene) and the polyanion of polystyrene sulfonic acid, and water.

10. The method according to claim 7, wherein the ratio of Component A, (not including the water) to Component B ranges from about 2:1 to about 1:100 by weight.

11. The method according to claim 7, wherein the additive is 2,2-dimethyl-1,3-dioxolane, cyclohexanone ethylene ketal, cyclohexanedione mono ethylene ketal and 2,2-dimethyl-3-methylhydroxy-1,3-dioxolane, $\Delta$-valerolactone, $\epsilon$-caprolactone and $\gamma$-butyrolactone, ethylene carbonate, styrene oxide, glycidol, ninhydrin, maleic anhydride, phthalic anhydride, acetic anhydride, 2-aminobutyric acid, 4-(dimethylamino)butyric acid, acetic acid, o-cresol, m-cresol, p-cresol, phenol, 4-hydroxyphenol, 4-hydroxybenzene sulfonic acid, phosphoric acid, or any combination thereof.

12. The method according to claim 7 where the transparent substrate has a glass transition temperature below 200° C.

13. The method of claim 7 further including the act of drying the mixture on the transparent substrate to form an optically transparent and electrically conductive film on the substrate.

14. The method of claim 13 where the act of drying is at a temperature of from about 80° C. to about 130° C.

* * * * *